(12) United States Patent
Cillessen et al.

(10) Patent No.: US 8,506,130 B2
(45) Date of Patent: Aug. 13, 2013

(54) OPTICAL ELEMENT FOR A LIGHT EMITTING DEVICE AND A METHOD OF MANUFACTURING THEREOF

(75) Inventors: Johannes Franciscus Maria Cillessen, Eindhoven (NL); Henricus Albertus Maria Van Hal, Vessem (NL); Hendrik Johannes Boudewijn Jagt, Eindhoven (NL); Oliver Jens Steigelmann, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 314 days.

(21) Appl. No.: 13/054,113

(22) PCT Filed: Jul. 15, 2009

(86) PCT No.: PCT/IB2009/053064
§ 371 (c)(1),
(2), (4) Date: Jan. 14, 2011

(87) PCT Pub. No.: WO2010/010484
PCT Pub. Date: Jan. 28, 2010

(65) Prior Publication Data
US 2011/0116263 A1    May 19, 2011

(30) Foreign Application Priority Data
Jul. 22, 2008  (EP) .................................... 08160876

(51) Int. Cl.
*F21V 33/00*    (2006.01)
(52) U.S. Cl.
USPC .................................... 362/311.02; 362/800

(58) Field of Classification Search
USPC ............................................ 362/311.02, 800
See application file for complete search history.

(56) References Cited

U.S. PATENT DOCUMENTS

| 8,083,364 B2 * | 12/2011 | Allen .............................. 362/84 |
| 8,141,384 B2 * | 3/2012 | Barnes et al. .................. 65/17.3 |
| 2004/0145308 A1 | 7/2004 | Rossner et al. |

(Continued)

FOREIGN PATENT DOCUMENTS

| DE | 19709690 A1 | 9/1998 |
| DE | 102006061175 A1 | 6/2008 |

(Continued)

*Primary Examiner* — Laura Tso
(74) *Attorney, Agent, or Firm* — Mark L. Beloborodov

(57) ABSTRACT

The present invention relates to an optical element for a light emitting device, wherein the optical element comprises a sintered ceramic body (3) comprising a wavelength converting layer (4) and a scattering layer (5), and to a method of manufacturing thereof. More specifically, the invention relates to an optical element, comprising a sintered ceramic body (3) of a first layer (4) and a second layer (5) arranged on the first layer, wherein the first layer comprises a wavelength converting material, the porosity of the second layer is higher than the porosity of the first layer, and pores in the second layer are arranged to provide scattering of a light beam. The method for manufacturing of the optical element comprises providing a green body comprising a first layer of a first material and a second layer of a second material; and co-sintering said layers into a sintered ceramic body; the compositions of the first and second layer are adapted such that after sintering, the porosity of the second layer is higher than the porosity of the first layer, and pores in said second layer are arranged to provide scattering of a light beam.

12 Claims, 1 Drawing Sheet

(56) References Cited

U.S. PATENT DOCUMENTS

| | | |
|---|---|---|
| 2005/0269582 A1 | 12/2005 | Mueller et al. |
| 2007/0126017 A1 | 6/2007 | Krames et al. |
| 2007/0284600 A1 | 12/2007 | Shchekin et al. |
| 2008/0116467 A1 | 5/2008 | Mueller et al. |
| 2008/0149956 A1 | 6/2008 | Mueller-Mach et al. |

FOREIGN PATENT DOCUMENTS

| | | |
|---|---|---|
| EP | 1873563 A1 | 1/2008 |
| WO | 2006097876 A1 | 9/2006 |
| WO | 2006111907 A1 | 10/2006 |
| WO | 2007085977 A1 | 8/2007 |
| WO | 2007107917 A2 | 9/2007 |
| WO | 2008056292 A1 | 5/2008 |

\* cited by examiner

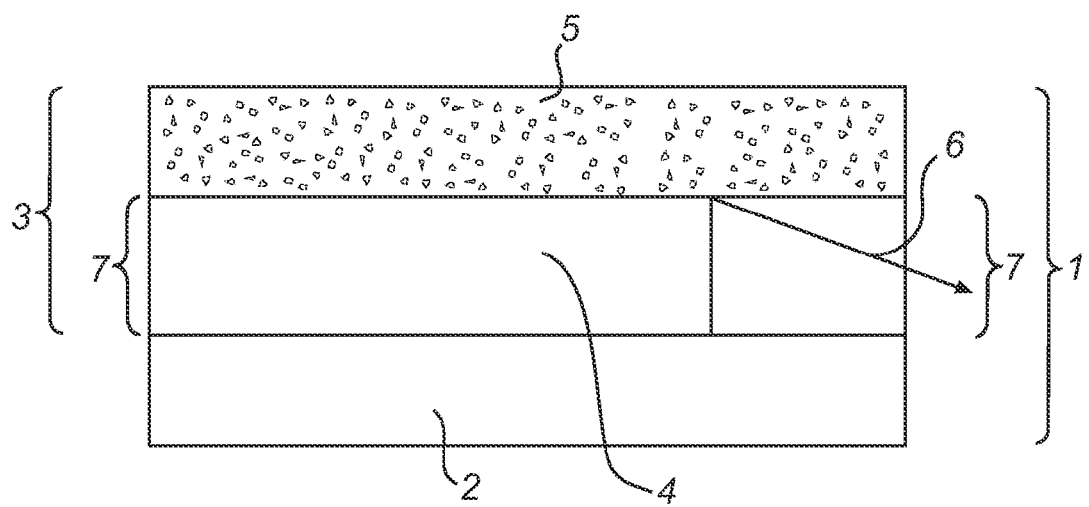

OPTICAL ELEMENT FOR A LIGHT EMITTING DEVICE AND A METHOD OF MANUFACTURING THEREOF

FIELD OF THE INVENTION

The present invention relates to an optical element for a light emitting device, wherein the optical element comprises a sintered ceramic body comprising a wavelength converting layer and a scattering layer, and to a method of manufacturing thereof.

BACKGROUND OF THE INVENTION

Light emitting devices comprise at least one light emitting diode (LED) which generally is arranged with an optical element. The optical element generally comprises a wavelength converting layer comprising a phosphor and/or a layer that redirects the emitted light. Thereby, the primary light emitted from the LED can be influenced in various ways.

A top-emitting LED refers to a light emitting diode having an optical element, wherein the light generated by the LED is illuminated at the top surface of the optical element. For optical elements in top-emitting LEDs, properties such a high transparency and optimal wavelength conversion are desired. This is preferably achieved by using an optical element comprising a wavelength converting layer, in which a light beam having a first wavelength is transformed by phosphor to a second wavelength and then transmitted through the layer.

A side-emitting LED refers to a light emitting diode having an optical element, wherein the light generated by the LED is illuminated at the side surfaces of the optical element. For optical elements in side-emitting LEDs, properties such a high transparency and optimal wavelength conversion generally are desired at the lower part of the optical element, while high reflectivity of the upper outer part of the optical element generally is desired. This is preferably achieved by using an optical element comprising a first wavelength converting layer, in which the light is transformed by phosphor and then reflected by a second layer.

US 2007/0284600 A1 describes a side-emitting LED comprising a wavelength converting layer and a reflector. The wavelength converting layer may be sintered phosphor particles or phosphor particles in a transparent or translucent binder, which may be organic or inorganic. The reflector can be a specular or diffusing reflector which causes the light to be reflected at many angles and ultimately at less than a critical angle. It is described that the specular reflector can be formed from organic or inorganic layers, for example aluminum or another reflective metal. Further, it is described that a diffusing reflector may be formed of a metal deposited on a roughened surface or a diffusing material, such as a suitable white paint.

There are several issues that have to be considered when optical elements comprise both a wavelength converting layer and a scattering layer. For example, it is desired to obtain good physical and optical contact; and thermal stability and to avoid chemical degradation.

Good physical contact between the wavelength converting layer and the scattering layer is of critical importance, in order to avoid mechanical failure, such as delamination, of the optical element. Currently, an additional adhesive layer is frequently used in order to achieve sufficient adhesion of the layers in the optical element. The optical element is exposed to temperature variations during use, which may result in heat-induced stresses caused by the use of materials with different thermal expansion properties in the wavelength converting layer and the scattering layer.

Good optical contact in-between the wavelength converting layer and the scattering layer is of importance since even a very fine gap between the two layers can cause light leakage at the sides in undesired angles. This may result in undesired deviations from the regular light intensity distribution.

In addition, chemical interactions between the wavelength converting layer and the scattering layer may result in degraded function of the optical element, such as destroyed luminescence or a change of the emission color.

Therefore, there is a need in the art for providing an optical element comprising a wavelength converting layer and a scattering layer for a light emitting device, and a manufacturing method thereof, wherein these disadvantages are overcome.

SUMMARY OF THE INVENTION

One object of the present invention is to at least partly overcome the above-mentioned problems of prior art and to meet the needs in the art, and thus to provide a ceramic optical element for a light emitting device and a method of manufacturing thereof.

It is a further object to provide a ceramic optical element which comprises a wavelength converting layer and a scattering layer, wherein the optical element is suitable for use in the manufacturing of light emitting devices comprising side-emitting LEDs. Especially, an intimate contact which enables high optical contact between the wavelength converting layer and the scattering layer is desired without using any adhesive.

It is also an object of the present invention to provide a manufacturing method of an optical element comprising a sintered ceramic body, wherein high physical contact between the wavelength converting layer and the scattering layer is provided, i.e. without the use of adhesives. Further, it is an object to provide a manufacturing method in which the two layers of the optical element are produced in the same manufacturing step. Furthermore, a robust material structure with high durability, a high manufacturing performance, and an easy and a cost-effective way of producing optical elements is desired.

Still another object of the present invention is to provide a light emitting device which has at least one essentially side-emitting element comprising a novel optical element.

Still another object of the present invention is to provide a method for providing a light emitting device, comprising an optical element according to the invention. These and other objects are achieved by methods and products according to the present invention.

In a first aspect, the present invention provides an optical element, comprising a sintered ceramic body of a first layer and a second layer arranged on the first layer, wherein the first layer comprises a wavelength converting material, wherein the porosity of the second layer is higher than the porosity of the first layer, and pores in the second layer are arranged to provide scattering of a light beam which is generated by a light source. By using an optical element according to the invention, an essentially side-emitting optical element is provided by using ceramic materials in both the wavelength converting layer and in the scattering layer. The optical element according to the invention has several advantages. For example, the use of only one ceramic body in the optical element results in a robust material structure. In addition, thermal instability can be essentially reduced or avoided by using only ceramic materials in both layers. Further, since only one sintered ceramic body is used, it is possible to achieve an intimate contact between the two layers, which results in an efficient optical coupling. Another advantage is that the invention allows for a perfect physical contact between the two components without making use of any adhesive.

In embodiments of the present invention, the reflectivity of the second layer of the optical element can be >90%. This high reflectivity results in a high side-emitting capability.

In embodiments of the present invention, the average diameter of pores in said second layer of the optical element can be in the range of from about 0.1 μm to about 1 μm. In order to provide efficient scattering of visible light the porosity is preferably within this interval.

In embodiments of the present invention, the porosity of the first layer of the optical element preferably can be below about 10%. This low porosity results in that few scattering centers are available in the first layer, which results in an efficient transmission of the light through the first layer.

In embodiments of the present invention, the thermal expansion coefficient of the first layer and the thermal expansion coefficient of the second layer of the optical element can be mutually matched, i.e. the thermal expansion coefficients in the layers are not deviating more than 10% from each other. By using materials with similar thermal coefficients, mechanical failure caused by exposure to thermal variations can be avoided. Thereby a prolonged lifetime of the optical element can be facilitated.

In embodiments of the present invention, the refractive index of the first layer and the refractive index of the second layer of the optical element can be mutually matched, i.e. the refractive indexes in the layers are not deviating more than 10% from each other. By using similar refractive indexes of the ceramic materials in the layers, the light rays are essentially uneffected, and hence undesired effects can be avoided.

In embodiments of the present invention, the optical element can comprise a first layer and a second layer, wherein the first layer comprises a first material and the second layer comprises a second material, wherein the first and the second material may comprise the same main constituents. Main constituents refers herein to the base material constituents which are comprised in the green bodies. As used herein, base material refers to a material which is present in a concentration of above 5%. By using the same main constituents, chemical interactions and thermal instabilities can be reduced or excluded. In addition, similar refractive index is provided in the layers.

In embodiments of the present invention, the fluxing agent concentration of the first layer can be higher than the fluxing agent concentration of the second layer. Fluxing agent refers herein to a component in the composition, which enhances the sintering process for example by filling in pores. The fluxing agent may have a melting temperature which is in a lower range than the main constituents. The choice of fluxing agent depends on which main constituents of the ceramic material that is going to be used in the optical element, and the amounts of the main constituents.

In embodiments of the present invention the first layer and second layer of the optical element can comprise a ceramic material comprising YAG structure. It was found that YAG is a suitable material to use for this kind of optical elements and that it is possible to achieve good optical results by using a YAG structured material in the optical element. YAG structured material refers herein to a ytterium aluminum garnet structure, wherein the lattice positions in the structure may be substituted and/or where interstitial positions may be filled.

In embodiments of the present invention, where the optical element comprises a YAG structured material, the first layer may comprise $SiO_2$ as fluxing agent in a concentration in the range of from about 200 ppm to about 2000 ppm and the second layer may comprise $SiO_2$ in a concentration in the range of from about 0 ppm to about 500 ppm. The inventors found that an almost dense first layer was provided and that an efficient scattering was obtained in the second layer.

In a second aspect, the present invention provides a light emitting device comprising at least one LED and an optical element according the invention, wherein the first layer of the optical element is arranged facing the LED to receive at least part of the light emitted by the LED. The present light emitting device has good side-emitting effect and good thermal stability, since ceramic materials are used in both layers.

In a third aspect, the invention provides a method for manufacturing an optical element comprising providing a green body comprising a first layer of a first material and a second layer of a second material; and co-sintering the layers into a single sintered ceramic body; the compositions of the first and second layer are adapted such that after sintering, the porosity of the second layer is higher than the porosity of the first layer and pores in the second layer are arranged to provide scattering of a light beam which is produced by a light source.

The method according to the present invention allows for the use of a co-sintering process for the layers. The method is advantageous from several aspects. According to the present method, the two layers are produced in the same manufacturing step. In addition, the present method facilitate high manufacturing performance, an easy and a cost-effective way of producing optical elements. Further, the co-sintering of the layers results in an intimate contact between the wavelength converting layer and the scattering layer, without the need for adhesives. Since a very good adhesion can be obtained by using this method, a robust optical element with high durability is provided. Other advantages are also provided, for example, this method allows for improved grinding capability of the usually more brittle second layer since the co-sintered layers provides a robust material structure.

In embodiments of the present method, the first layer can comprise a material composition which during sintering has a higher densification than the second layer. By modifying the ceramic composition of the layers the level of densification can be controlled. Accordingly, a dense structure can be obtained in the first layer, while a porous layer can be obtained in the second layer.

In embodiments of the present method, the porosity can be controlled by using higher amount of fluxing agent in the first layer than in the second layer. By varying the concentration of the fluxing agent, the porosity, and hence the reflectivity, within an optical element can be controlled. A high concentration of fluxing agent results in a low temperature of sintering to high density. Hence, preferably a high concentration of fluxing agent is used in the first layer, wavelength converting layer, while the fluxing agent concentration in the second layer is kept lower than in the first layer in order to provide scattering. This results in that the densification process is less efficient in the second layer which results in a porous structure.

In embodiments of the present method, the first layer comprises a first material and the second layer comprises a second material, wherein the first and second material comprise the same main constituents. Thus, chemical interactions and thermal instabilities can be reduced or excluded. In addition, similar refractive index is provided in the layers.

In a fourth aspect, the present invention provides a method for manufacturing a light emitting device comprising at least one LED, comprising: providing an optical element according to any of the product claims or obtainable by any of the method claims; and arranging the optical element to receive at least part of the light emitted by the light emitting diode, and such that the first layer faces at least one LED. By using the optical element according to the invention in the manufacturing of a light emitting device, a light emitting device with high durability is provided.

BRIEF DESCRIPTION OF THE DRAWINGS

The invention will now be described in more detail with reference to the accompanying schematic drawing, which by way of example illustrate a currently preferred embodiment of the invention.

FIG. 1 shows an example of an optical element according to the invention which is mounted onto a LED.

DETAILED DESCRIPTION OF THE INVENTION

In general, the present invention relates to an optical element for a light emitting device, wherein the optical element comprises a wavelength converting layer and a scattering layer, formed by a single sintered ceramic body, and a manufacturing method thereof.

A schematic drawing on one embodiment of the present invention is shown in FIG. 1, showing a light emitting device 1 comprising a light emitting diode (LED) 2, an optical element 3 comprising a sintered ceramic body of a first layer 4 and a second layer 5 arranged on the first layer 4, wherein the first layer 4 comprises a wavelength converting material, the porosity of said second layer 5 is higher than the porosity of said first layer 4. The light emitting device 1 is constructed differently depending on the application. The light emitting device 1 comprises at least one LED 2 which is producing a light beam, such as visible light, UV-radiation, or IR light. The LED 2 can be obtained according to conventionally well-known methods. The LED 2 may be exchanged to any other light source, if desired. The optical element 3 comprises a sintered ceramic body and is arranged facing the LED 2 directly or indirectly. The optical element 3 comprises a first layer 4, which is located at the lower part of the optical element 3 and a second layer 5.

The first layer 4 is essentially a dense ceramic layer and comprises a wavelength converting material, such as phosphors. The ceramic material may comprise any materials that can be considered as ceramic. Examples of phosphors that may be formed into the ceramic wavelength converting layers include aluminum garnet phosphors with the general formula $(Lu_{1-x-y-a-b}Y_xGd_y)_3(Al_{1-z}Ga_z)_5O_{12}:Ce_aPr_b$, wherein $0<x<1$, $0<y<1$, $0<z\leq0.1$, $0<a\leq0.2$ and $0<b\leq0.1$, such as $Lu_3Al_5O_{12}:Ce^{3+}$ and $Y_3Al_5O_{12}:Ce^{3+}$ which emit light in the yellow-green range; and $(Sr_{1-x-y}Ba_xCa_y)_{2-z}Si_{5-a}Al_aN_{8-a}O_a$: $Eu_z^{2+}$ wherein $0\leq a<5$, $0<x\leq1$, $0\leq y\leq1$, and $0<z\leq1$, such as $Sr_2Si_5N_8:Eu^{2+}$, which emit light in the red range. Suitable $Y_3Al_5O_{12}:Ce^{3+}$ ceramic slabs may be purchased from Baikowski International Corporation of Charlotte, N.C. Other green, yellow, and red emitting phosphors may also be suitable, including $(Sr_{1-a-b}Ca_bBa_c)Si_xN_yO_z:Eu_a^{2+}$ (a=0.002-0.2, b=0.0-0.25, c=0.0-0.25, x=1.5-2.5, y=1.5-2.5, z=1.5-2.5) including, for example, $SrSi_2N_2O_2:Eu^{2+}$; $(Sr_{1-u-v-x}Mg_u Ca_vBa_x)(Ga_{2-y-z}Al_yIn_z)S_4):Eu^{2+}$ including, for example, $SrGa_2S_4:Eu^{2+}$; $Sr_{1-x}Ba_xSiO_4:Eu^{2+}$; and $(Ca_{1-x}Sr_x)S:Eu^{2+}$ wherein $0<x\leq1$ including, for example, $CaS:Eu^{2+}$ and $SrS:Eu^{2+}$. The porosity of the first layer is preferable below about 10%, more preferably below about 5%.

The second layer 5 is essentially a porous ceramic layer, and comprises pores which are arranged to provide scattering of a light beam. The second layer can be designed to reflect any particular wavelength interval, such as visible light, UV-radiation or IR-radiation. The term porosity herein therefore refers to cavities with a size of about from 0.2 µm to about 20 µm which are present in the ceramic material after sintering.

The porosity is preferably distributed evenly through the second layer of the optical element. The size distribution of the pores vary depending on the staring material and the sintering conditions. For example, the resulting porosity during sintering depends on the particle size of the powder that is used for a greenbody. It is also well-known that the conditions during pressing of a green body is of importance in order to avoid large undesired pores. The skilled man in the art knows how to optimize the pressing conditions in order to reduce the risk for such deviations in the green body. In order to provide an efficient scattering of a light beam, the size of pores in the second layer after sintering should be in the range of the corresponding wavelength of the light beam that is to be scattered. Accordingly, for scattering of visible light, the average pore diameter in the second layer is preferably 0.1-1 µm.

It should be noted that even though the same main constituents may be used in both layers, the concentrations of the different base materials in the first layer may be different from the second layer. The functional properties of the first layer can be provided by additives for examples dopants to the material composition of the first layer. The function of the second layer is controlled by varying the porosity, for example by varying the concentration of fluxing agent which results in that the sintering rate of the two layers will be different to each other.

Advantageously, by using the same main ceramic constituents in the first and second layer, the thermal expansion coefficients of the layers are mutually matched. In addition, the refractive index of the first layer and the refractive index of the second layer are mutually matched.

Returning now to FIG. 1, showing a schematic drawing of an embodiment of the invention, showing a light beam 6 which is generated by the LED 2. The generated light beam 6 passes through the first layer of the optical element and transforms depending on the presence of different wavelength converting materials. The light beam 6 is then reflected at the by the second layer 5 and finally the light beam is emitted essentially at one of the side-surfaces 7 of the first layer 4 of the optical element 3.

The invention also includes a method for manufacturing an optical element comprising providing a green body comprising a first layer of a first material and a second layer of a second material; and co-sintering the layers into a sintered ceramic body, wherein the compositions of the first and second layer are adapted such that after sintering, the porosity of the second layer is higher than the porosity of the first layer. The green bodies may be obtained by pressing a powder, hot pressing or any other conventionally known method. As used herein, the term "green bodies" refers to pressed or compacted bodies which are not sintered. The co-sintering results in a single sintered body. The sintered interface may comprise an elemental concentration gradient formed during the sintering process of the layers. Co-sintering is performed by well-known techniques at high temperatures, such as including pressing and/or exposure in a controlled gaseous atmosphere.

The porosity of the two layers 4,5 can be controlled by using higher amount of fluxing agent in the first layer than in the second layer. In general, the more fluxing agent that is used, the faster the densification process during sintering occurs, which results in reduced size of the pores and reduced porosity. Hence, it is possible to obtain an almost dense structure of the first layer, while the second light may comprise significant amount of pores, which can be used for scattering of a light beam.

The porosity can also be adapted by using a material composition in the first layer 4 which during sintering has a higher sintering rate than the second layer 5. This can be done by varying the concentration of specific ceramic main constituents or minor ceramic constituent in the two layers. The method may therefore comprise, that the materials of the first layer and the second can comprise the same main or minor ceramic constituents, but wherein the concentrations of the constituents in the two layers are varied.

Optionally, the porosity may be controlled by varying any condition that is relevant for the porosity obtained after sintering, such as the particle size of the powders and/or using different pressing conditions of the two layers.

The optical element of the present invention can be used in the manufacturing of a light emitting device comprising at least one LED, wherein the optical element can be arranging to receive at least part of the light emitted by the light emitting device, and such that the first layer faces at least one LED. Thereby, a light emitting device comprising an essentially side-emitting LED can be provided.

Although the present invention has been described in connection with particular embodiments thereof, it is to be understood that various modifications, alterations and adaptations may be made by those skilled in the art without departing from the claimed scope.

For example, the optical element according to the invention may comprise additional layers, for example several wavelength converting layers. The layers in the optical element may be continuous or discontinuous. In addition, the thickness of the layers can be varied as long as the objects of the optical element is obtained. For example, the thickness of the second layer of the optical element can be 10-300 nm, such as 80-150 nm, or 120 nm. In further embodiments of the invention, the layers in the optical element do not have a constant thickness. Further, other additional layers may be included in the optical element.

In embodiments of the present invention, at least one layer of the two layers may comprise one or several additives in order to provide desired material properties or functional properties of the layer/s. The same or different additives may be used in both the layers, and the concentrations may vary depending on the application of the optical element.

It is to be understood that the method according to the invention can be modified without departing from the scope of the invention. For example, the green bodies can be pre-treated such as by separate heating and then mounted together and finally sintered.

The invention is further illustrated by the following example, which is not to be construed as limiting, but merely as an illustration of some preferred features of the invention.

Example 1

Preparation of an optical element according to the invention comprising a first layer, wavelength converting layer, and a second layer with scattering properties, wherein the optical element is based on $Y_3Al_5O_{12}$.

The following oxide constituents were used for the green bodies:

$Y_2O_3$, specific area 15 m²/g, obtainable from Rodia;
$Al_2O_3$, specific area 8 m²/g, obtainable from Reynolds/Malakoff;
$CeO_2$, specific area 4 m²/g, obtainable from Rodia; and
$Gd_2O_3$ (in case of red-shifted wavelength converting layer), specific area 17 m²/g.

In addition, $SiO_2$, which is a suitable fluxing agent for sintering of $Y_3Al_5O_{12}$ based ceramic materials was added to the first layer in a concentration of 200-2000 ppm and to the second layer in a concentration of 0-500 ppm. The first layer was doped with 0.01-2% Ce.

The green bodies were prepared by uniaxial pressing of the two powder-layers (layer 4 and 5 in FIG. 1) in one go, followed by cold-isostatic-pressing for maximum densification. Sintering were then performed at 1650° C. in air, using a heating temperature ramp of 125° C./hr, 4 hours exposure at top temperature, and a temperature ramp of 125° C./hr down.

Thereby the two layers were reactively sintered resulting in one ceramic body of $Y_3Al_5O_{12}$ type comprising two layers. This is because using the sintering parameters above, and the above mentioned $SiO_2$ concentrations in the first powder layer and in the second powder-layer results in that the first layer becomes almost dense, while the second layer becomes porous, wherein pores in the second layer provide an efficient scattering for visible light.

The invention claimed is:

1. An optical element (3), comprising a sintered ceramic body of a first layer (4) and a second layer (5) arranged on said first layer (4), wherein said first layer (4) comprises a wavelength converting material, the porosity of said second layer (5) is higher than the porosity of said first layer (4), and pores in said second layer (5) are arranged to provide scattering of a light beam.

2. An optical element (3) according to claim 1, wherein the reflectivity of said second layer (5) is >90%.

3. An optical element (3) according to claim 1, wherein the average diameter of the pores in said second layer (5) is in the range of from 0.1 µm to 1 µm.

4. An optical element (3) according to claim 1, wherein the porosity of said first layer (4) is below about 10%.

5. An optical element (3) according to claim 1, wherein the thermal expansion coefficient of said first layer (4) and the thermal expansion coefficient of said second layer (5) are mutually matched.

6. An optical element (3) according to claim 1, wherein the refractive index of said first layer (4) and the refractive index of said second layer (5) are mutually matched.

7. An optical element (3) according to claim 1 wherein said first layer (4) comprises a first material and said second layer (5) comprises a second material, wherein said first and said second material comprise the same main constituents.

8. An optical element (3) according to claim 1, wherein the fluxing agent concentration of said first layer (4) is higher than the fluxing agent concentration of said second layer (5).

9. An optical element (3) according to claim 1, wherein the first layer (4) and second layer (5) comprise a ceramic material comprising YAG structure.

10. An optical element (3) according to claim 9, wherein the first layer (4) comprises $SiO_2$ in a concentration in the range of from 200 ppm-2000 ppm and second layer (5) comprises $SiO_2$ in a concentration in the range of from 0 ppm-500 ppm.

11. A light emitting device (1) comprising at least one light emitting diode (2) and an optical element (3) according to claim 1, wherein said first layer (4) of said optical element is arranged facing said light emitting diode (2) to receive at least part of the light emitted by said light emitting diode (2).

12. A method for manufacturing a light emitting device (1) comprising at least one light emitting diode (2), comprising:
providing an optical element (3) according to claim 1; and arranging said optical element (3) to receive at least part of the light emitted by said light emitting diode (2), and such that said first layer (4) faces at least one light emitting diode.

* * * * *